(12) United States Patent
Butscher et al.

(10) Patent No.: US 9,986,660 B2
(45) Date of Patent: May 29, 2018

(54) CONDUCTION COOLED AUTONOMOUS GIMBALED INERTIAL MEASUREMENT UNIT

(71) Applicant: The Boeing Company, Chicago, IL (US)

(72) Inventors: Stephen Butscher, Huntington Beach, CA (US); James K. Gingrich, Newark, OH (US); Shaun Detloff, Huntington Beach, CA (US); Joseph Brent Templeton, Anaheim, CA (US); Dwayne C. Merna, Yorba Linda, CA (US); Joseph Eugene Justin, Corona, CA (US)

(73) Assignee: The Boeing Company, Chicago, IL (US)

( * ) Notice: Subject to any disclaimer, the term of this patent is extended or adjusted under 35 U.S.C. 154(b) by 141 days.

(21) Appl. No.: 15/015,855

(22) Filed: Feb. 4, 2016

(65) Prior Publication Data
US 2017/0231114 A1  Aug. 10, 2017

(51) Int. Cl.
*G01P 3/00* (2006.01)
*H05K 7/20* (2006.01)
(Continued)

(52) U.S. Cl.
CPC ......... *H05K 7/20218* (2013.01); *B64D 43/00* (2013.01); *B64G 1/288* (2013.01);
(Continued)

(58) Field of Classification Search
CPC ........ B60D 43/00; B64G 1/288; G01C 19/00; G01C 1/006; G01P 15/00; G01P 15/04;
(Continued)

(56) References Cited

U.S. PATENT DOCUMENTS 3,216,263 A * 11/1965 Culver ................... G01C 19/58
                                                                250/231.12
3,812,727 A *  5/1974 Pitzer .................... G01P 15/121
                                                                 73/514.12

(Continued)

OTHER PUBLICATIONS

Marvin A. Biren, "The Trident II (Mk-6) Guidance System," The Charles Stark Draper Laboratory, Inc. Cambridge, Massachusetts, http://arc.aiaa.org I DOI: 10.2514/6.1991-2761, downloaded Jan. 9, 2015, 4 pages.*

(Continued)

*Primary Examiner* — Manish S Shah
*Assistant Examiner* — Nigel Plumb
(74) *Attorney, Agent, or Firm* — Hanley, Flight & Zimmerman, LLC (57) ABSTRACT

Conductive cooled gimbaled inertial measurement units are disclosed herein. An example apparatus includes an inertial measurement unit, a gimbal assembly in which the inertial measurement unit is disposed, the gimbal assembly having gaps between each gimbal of the gimbal assembly, the gaps including a gas to conduct heat from the gimbal assembly, and an isothermal dome at least partially surrounding the gimbal assembly, the isothermal dome having a cooling tube disposed on an external surface of the isothermal dome to transfer heat from the gimbal assembly via conduction.

20 Claims, 5 Drawing Sheets

(51) Int. Cl.
  *G01P 15/00* (2006.01)
  *G01C 19/00* (2013.01)
  *B64D 43/00* (2006.01)
  *B64G 1/28* (2006.01)
  *G01P 1/00* (2006.01)

(52) U.S. Cl.
  CPC .............. *G01C 19/00* (2013.01); *G01P 1/006* (2013.01); *G01P 15/00* (2013.01)

(58) Field of Classification Search
  CPC .. G01P 1/006; G01P 1/08; G01P 3/189; G01P 21/02; G01H 1/00; A63B 2220/40
  USPC ......... 73/497, 498, 499, 492, 1.37, 652, 488
  See application file for complete search history.

(56) References Cited

U.S. PATENT DOCUMENTS

| | | | | |
|---|---|---|---|---|
| 5,097,899 | A | * | 3/1992 | Martin .................. B21D 53/04 165/169 |
| 2009/0293618 | A1 | * | 12/2009 | Tamura .................. G01P 1/006 73/514.33 |

OTHER PUBLICATIONS

European Patent Office, Partial European Search Report, issued in connection with European Patent Application No. 17151552.1, dated Jun. 23, 2017, 14 pages.

European Patent Office, Extended European Search Report, issued in connection with European Patent Application No. 17151552.1, dated Oct. 13, 2017, 12 pages.

\* cited by examiner

CONDUCTION COOLED AUTONOMOUS GIMBALED INERTIAL MEASUREMENT UNIT

FIELD OF THE DISCLOSURE

This disclosure relates generally to gimbals and more, particularly, to conduction cooled gimbaled inertial measurement units.

BACKGROUND

In some applications, inertial measurement units are used in navigation systems. The inertial measurement units are temperature sensitive and must be temperature controlled. Typically, inertial measurement units are cooled using an internal fan with flow diffusers. In some examples, internal bellyband cooling tubes may also be used to cool the inertial measurement unit.

SUMMARY

An example apparatus includes an inertial measurement unit, a gimbal assembly in which the inertial measurement unit is disposed, the gimbal assembly having gaps between each gimbal of the gimbal assembly, the gaps including a gas to conduct heat from the gimbal assembly, and an isothermal dome at least partially surrounding the gimbal assembly, the isothermal dome having a cooling tube disposed on an external surface of the isothermal dome to transfer heat from the gimbal assembly via conduction.

Another example apparatus includes a stable member of a gimbal assembly, the stable member including an electronics assembly disposed within a cavity of the stable member, an inertial measurement unit of a navigation system including a gyroscope and an accelerometer, the gyroscope and accelerometer disposed within the stable member, one or more gimbals operatively coupled to the stable member, each of the one or more gimbals including a thermal shell attached to a central portion of the gimbal to facilitate conductive heat transfer, and an isothermal dome at least partially surrounding the one or more gimbals, the isothermal dome including a cooling tube to enable cooling of the inertial measurement unit via conductive heat transfer.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

The apparatus disclosed herein is related to conduction cooled gimbaled inertial measurement units (IMUs). More specifically, the example apparatus described herein is operative to maintain a gimbaled IMU at a substantially constant temperature using conduction heat transfer to cool the components of the IMU. Conduction heat transfer is implemented to cool the IMU due to the reliability (e.g., predictability, accuracy of a heat transfer model) of heat transfer via conduction versus, for example, heat transfer via convection.

An example IMU of the example apparatus disclosed herein is an automatic IMU and does not require additional instruments (e.g., a stellar star sensor) to navigate or determine the position of a vehicle in which the IMU is installed. The IMU may be disposed within a gimbal assembly including three gimbals having axes of rotation offset by 90 degrees. Thermal shells are operatively coupled to one or more of the gimbals to facilitate conductive heat transfer through the gimbal assembly. The gimbal assembly includes gaps sized (e.g., 0.020 inch to 0.040 inch) to reduce (e.g., substantially prevent) convection flow and/or heat transfer due to the convection flow within the gaps. The gaps are uniform (e.g., the gaps are substantially the same width (varying between 0.020 inch to 0.040 inch) from any portion of one gimbal or thermal shell to any portion of a second gimbal or second thermal shell) to facilitate conductive heat transfer. A gas disposed in the gaps and the gimbal assembly aids the conductive heat transfer and may be a composition including a combination of nitrogen, helium, and/or neon gas.

The gimbal assembly may be disposed in an isothermal dome that at least partially surrounds the gimbal assembly. The isothermal dome is shaped and sized to maintain a substantially small gap between the outer gimbal and the dome to facilitate conductive heat transfer between the gimbal assembly and the isothermal dome. The isothermal dome includes cooling tubes operatively coupled to the surface of the dome, which aid conductive heat transfer and enable maintenance of a substantially constant temperature of the IMU. A fluid flowing through the cooling tubes may be temperature controlled using a chiller system that is external to the apparatus but within the vehicle in which the gimbal assembly is mounted to maintain the substantially constant temperature of the IMU. A hermetic enclosure surrounds the isothermal dome to provide an airtight seal around the apparatus to maintain the composition of the gas (e.g., a thermally conductive gas) disposed within the hermetic enclosure and/or the gaps of the gimbal assembly.

Figure 1:
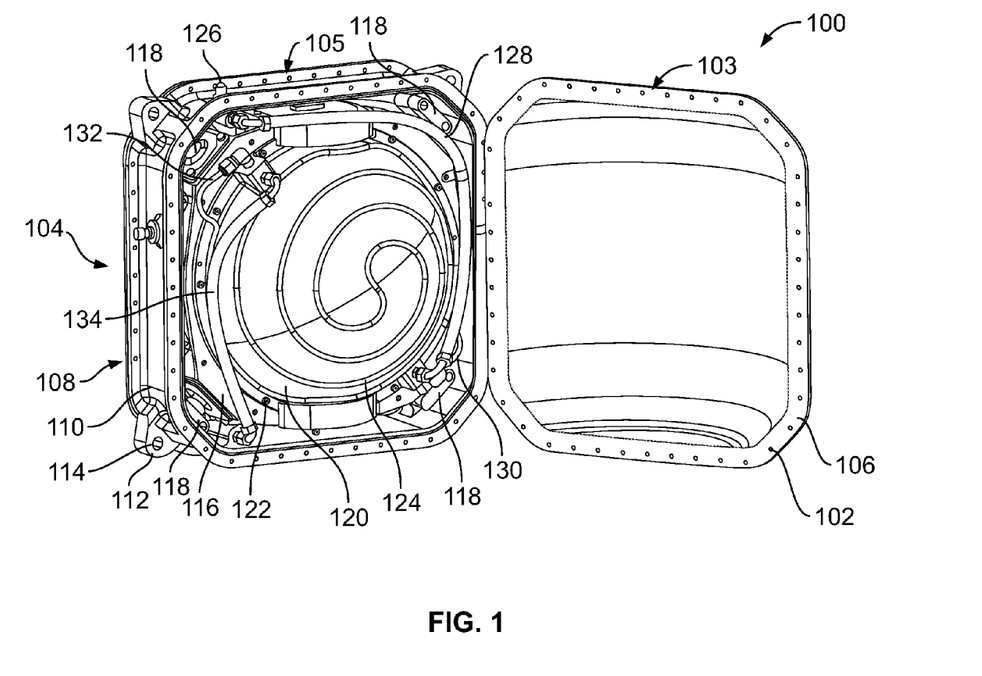
FIG. 1 represents an example apparatus described herein.
Figure 5:
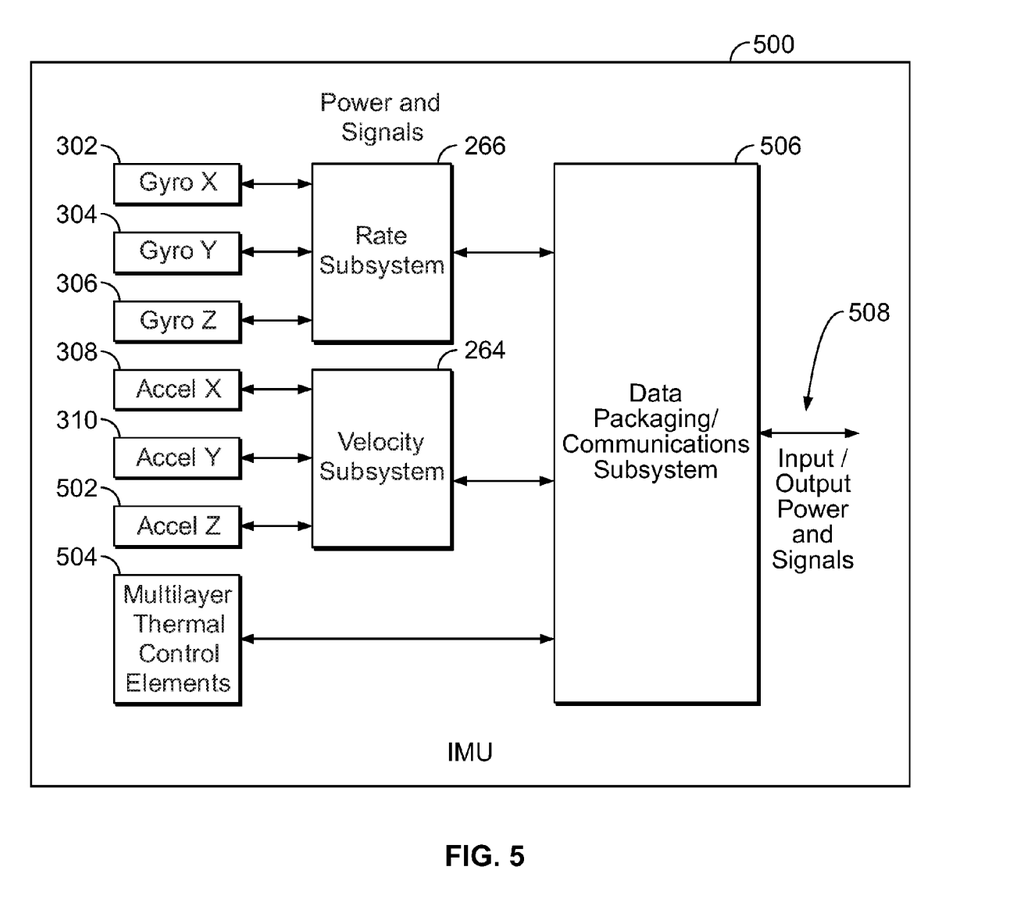
FIG. 5 is a block diagram of an example inertial measurement unit.

FIG. 1 represents an example apparatus 100 that may be implemented to conductively cool a gimbaled IMU, such as, for example, an example IMU 500 depicted in FIG. 5. The example apparatus 100 has a height of 15.3 inches, a width of 16.5 inches, and a depth of 13.0 inches. However, the dimensions described herein are not limiting and in other examples the apparatus 100 may have different dimensions to accommodate a particular application. Additionally, the example apparatus 100 may have a total weight of about 80 pounds, where 66 pounds of that total weight is supported by isolators (e.g., isolators 118 discussed in more detail below), and 48 pounds of the total weight is rotating as part of a gimbal assembly (e.g., a gimbal assembly 104 discussed in more detail below).

The example apparatus 100 includes a hermetic enclosure 102 completely surrounding the gimbal assembly 104 to maintain a gas composition or mixture (e.g., a gas composition including helium, nitrogen, and/or neon) within the hermetic enclosure 102. Alternatively, a liquid or liquid mixture may be disposed within the hermetic enclosure 102. In some examples, the hermetic enclosure 102 may be made out of a metal, such as aluminum or steel (e.g., stainless steel). The hermetic enclosure 102 may include one or more seals disposed adjacent interfaces 103, 105 of one or more portions of the hermetic enclosure 102. For example, the hermetic enclosure 102 includes a front cover 106, a back cover 108, and an IMU mount 110, and seals may be disposed at the interface 103 between the front cover 106 and the IMU mount 110 and the interface 105 between the back cover 106 and the IMU mount 110.

The IMU mount 110 includes tabs or mounting brackets 112 to mount the apparatus in a vehicle (e.g., a spacecraft, an aircraft, a missile, etc.). The example tabs 112 include holes 114 to receive respective fasteners (e.g., bolts). The tabs 112 enable the apparatus 100 to be mounted in a vehicle such that the apparatus 100 can be serviced or maintained by removing a panel or opening a door on a side of the vehicle and, thus, does not require the vehicle to be dismantled to perform maintenance on the apparatus 100. In the example apparatus 100, the tabs 112 are positioned at the corners of the IMU mount 110. Alternatively, the tabs 112 may be positioned on the sides of the IMU mount 110. Positioning the tabs 112 on the IMU mount 110 allows the example apparatus 100 to be installed and/or removed as a whole by removing fasteners from the tabs 112, to facilitate installation and removal.

The example gimbal assembly 104 is disposed within the hermetic enclosure 102. The gimbal assembly 104 is coupled to the IMU mount 110 of the hermetic enclosure 102 via a gimbal mount 116. The gimbal mount 116 may be attached to the IMU mount 110 of the hermetic enclosure 102 using one or more isolators and/or shock absorbers 118 (e.g., elastomeric isolators). In some examples, the isolators 118 reduce the vibration and/or interference experienced by the gimbal assembly 104 that may occur when the vehicle in which the apparatus 100 is positioned is in motion. The isolators 118 are positioned within the hermetic enclosure 102 to facilitate maintenance of the apparatus 100 and/or eliminate the need for the apparatus 100 to include a flexible mounting structure to keep the IMU isolated from movement or interference in the environment (e.g., movement of the vehicle). Mounting the gimbal assembly 104 to the IMU mount 110 simplifies assembly of the apparatus 100 and does not require the covers 106 and 108 to support any structure. The example apparatus 100 can be maintained or serviced without removing the apparatus 100 from the vehicle in which the apparatus 100 is installed because the covers 106 and 108 can be easily removed without having to remove the IMU mount 110 or any of the gimbal assembly 104 components. The covers 106 and 108 are primarily operative to seal the gimbal assembly 104 from the external environment.

The apparatus 100 also includes an example isothermal dome 120 to at least partially surround the example gimbal assembly 104. The example isothermal dome 120 is coupled to a surface of the gimbal mount 116 via a flange (e.g., a flange 212 or 214 of FIG. 2) of the isothermal dome 120 and one or more fasteners (e.g., bolts) 122. A central portion of the isothermal dome 120 fits within the example gimbal mount 116. As show in the exploded view of FIG. 2, the isothermal dome 120 includes two substantially similar halves coupled to the gimbal mount 116. The isothermal dome 120 is sized to include a gap between an outer gimbal (e.g., an outer gimbal 222 of FIG. 2) of the gimbal assembly 104 and the interior of the isothermal dome 120 that is substantially small (e.g., a gap that is approximately 0.020-0.040 inch) such that the gap facilitates heat transfer via conduction and reduces (e.g., limits, substantially eliminates) heat transfer via convection. The reduction or elimination of heat transfer via convection allows for more predictable heat transfer and, thus, more accurate temperature control of the gimbal assembly 104.

A cooling coil or tube 124 is disposed on an external (e.g., outer) surface of each half of the isothermal dome 120. The cooling tubes 124 are operative to control a temperature of an IMU disposed within the gimbal assembly 104 and/or maintain the temperature of the isothermal dome 120 substantially constant. In the illustrated example, the cooling tubes 124 are arranged in a spiral-like pattern. Alternatively, the cooling tubes 124 may be arranged in any other suitable pattern. The example cooling tubes 124 may be disposed within grooves on the surface of the isothermal dome 120 and/or fixed via brazing to the surface of the isothermal dome 120. Alternatively, the cooling tubes 124 may be attached to the isothermal dome 120 using any other suitable method including but not limited to welding, gluing, casting, etc. The cooling tubes 124 may be made of a metal such as, for example, aluminum or stainless steel. The cooling tubes 124 are operatively coupled to a chiller system external to the apparatus 100 via a fluid inlet port 126 and a fluid outlet port (e.g., fluid outlet port 202 of FIG. 2). Alternatively or additionally, external thermoelectric coolers (e.g., TECs) are used to replace and/or supplement a chiller and/or cooling lines. In-flight cooling may, in some applications, use a bottle feed of compressed gas for cooling the isothermal dome 120. An inlet tube 128 may be connected to the fluid inlet port 126 at the top (in the orientation shown in FIG. 1) of the IMU mount 110. The inlet tube 128 may curve around the inside of the hermetic enclosure 102 and operatively couple to a first end 130 of the cooling tube 124. A second end 132 of the cooling tube 124 is operatively coupled to an outlet tube 134 disposed within the hermetic enclosure 102 and coupled to an outlet port positioned on a side of the IMU mount 110 opposite the inlet port 126. The inlet and outlet tubes 128, 134 may be made of a flexible material such as, for example, Teflon with a stainless steel braid. The inlet port 126 is also coupled to an inlet tube and cooling tube on the other half of the isothermal dome 120. Similarly, a cooling tube on the other half of the isothermal dome 120 is coupled to an outlet tube and the outlet port. Thus, the fluid at the inlet port 126 splits into two portions or flow passages, each portion flowing through cooling tubes on respective halves of the isothermal dome 120, and both portions to recombine at the outlet port. Alternatively, the flow of the fluid may be reversed, thus making the inlet 126 the fluid outlet and the outlet 134 the fluid inlet.

The cooling tubes 124 contain a controlled temperature fluid (e.g., a cooling fluid) to maintain the isothermal dome 120 at a substantially constant temperature. The controlled temperature fluid may include sodium chromate, distilled water, glycol, etc. The temperature of the fluid is maintained at a specified fluid temperature using the chiller system external to the apparatus 100. The chiller system may include a controller to control the chiller system and maintain the fluid in the cooling tubes 124 at the specified fluid temperature. In some examples, the specified fluid temperature is selected based on a thermal model of conductive heat transfer through the gimbal assembly 104. Additionally or alternatively, the specified fluid temperature is adjusted based on sensors in the gimbal assembly 104.

Figure 2:
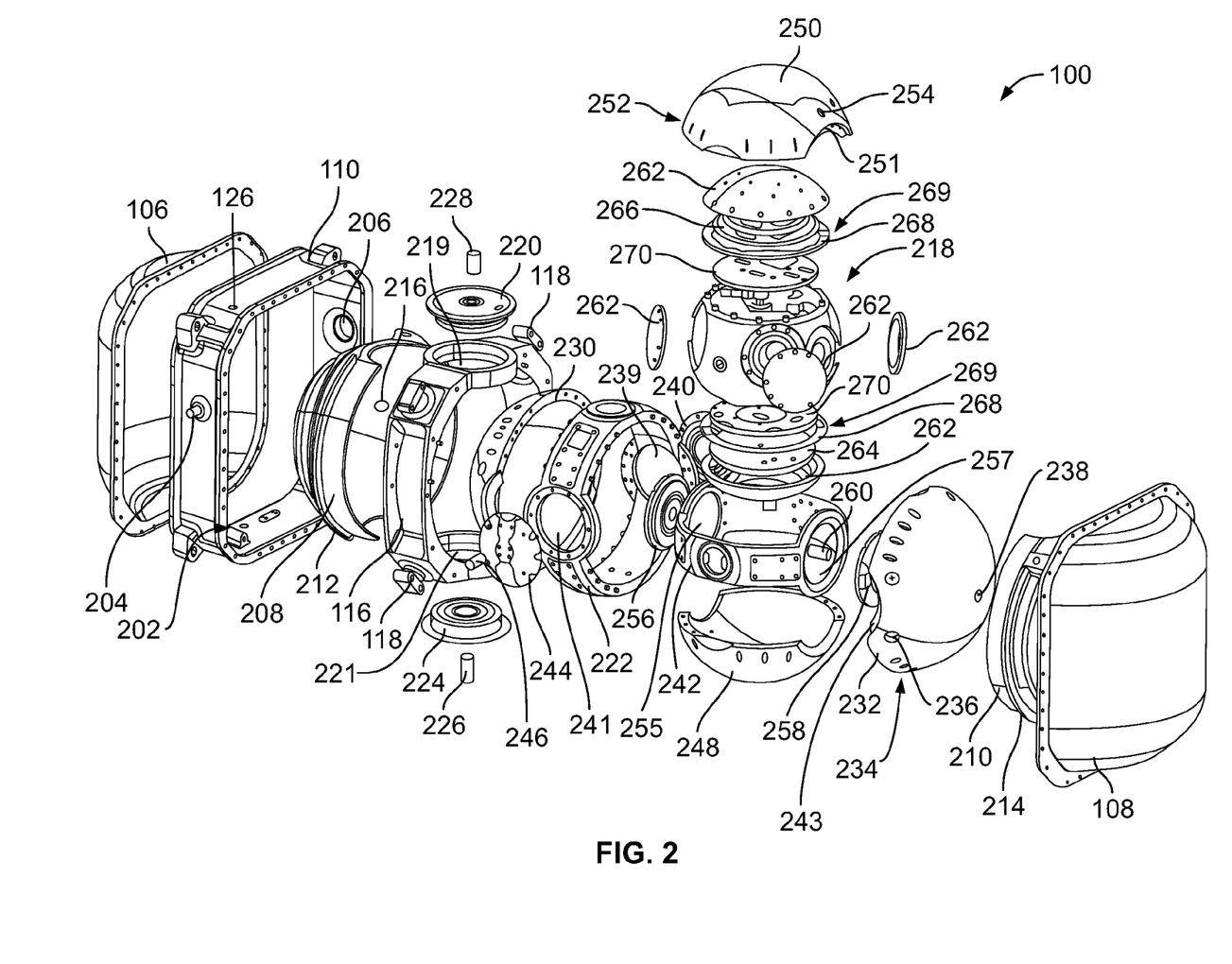
FIG. 2 is an exploded view of the example apparatus of FIG. 1.

FIG. 2 is an exploded view of the example apparatus 100 of FIG. 1 depicting the three separate pieces of the hermetic enclosure 102 (e.g., the covers 106 and 108 and the IMU mount 110). The fluid inlet port 126 is positioned on a top surface of the IMU mount 110 and the fluid output port 202 is positioned on the bottom surface of the IMU mount 110 opposite the fluid inlet port 126. The IMU mount 110 may also include an air inlet port 204 and a primary electrical connection 206 (e.g., a military standard electrical connection).

The exploded view also depicts a first half 208 and a second half 210 of the isothermal dome 120 of FIG. 1. As discussed above, the cooling tubes 124 are disposed on both the first and second halves 208 and 210 of the isothermal dome 120. The first and second halves 208 and 210 also include the first flange 212 and the second flange 214, respectively. The first and second flanges 212 and 214 are operative to couple to opposing surfaces of the gimbal mount 116. A remaining smooth, curved surface of each of the halves 208 and 210 fits within the gimbal mount 116. In the illustrated example, the first half 208 of the isothermal dome 120 includes an optical port 216. The optical port 216 may be operative during testing and/or calibration to enable a user to determine the position of a stable member 218 within the gimbal assembly 104. In some examples, the optical port 216 is excluded.

The gimbal mount 116 includes a first aperture 219 and a second aperture 221 opposite the first aperture 219. The first aperture 219 may receive an outer gimbal motor 220 to control the position of the outer gimbal 222 based on feedback from one or more accelerometers or gyroscopes described in greater detail below. The second aperture 221 may receive an outer gimbal synchro 224 (e.g., an electrical resolver) to provide a signal representing an incremental, angular movement or position of the outer gimbal 222 relative to a zero point. Slip rings 226, 228 are disposed within the outer gimbal motor 220 and the outer gimbal synchro 224, respectively, to facilitate rotation of the outer gimbal 222 with electrical connection(s). The example outer gimbal motor 220 and outer gimbal synchro 224 include low friction bearings to facilitate rotation.

The outer gimbal 222 is disposed within the gimbal mount 116 and coupled to the gimbal mount 116 via the outer gimbal motor 220, the outer gimbal synchro 224, and the slip rings 226 and 228. The outer gimbal 222 is substantially ring-shaped and two thermal shells 230 and 232 are coupled to either side of the outer gimbal 222 using fasteners disposed through holes 234 on the thermal shells 230 and 232. In some examples, weights may be disposed in counter bores 236 of the isothermal shells 230 and 232. For example, weights may be added to one or more of the counter bores 236 to balance the isothermal shells 230 and/or 232. The outer gimbal 222 and the thermal shells 230 and 232 are machined as an assembly to achieve tight tolerances to provide the substantially small, uniform gaps (e.g., 0.020-0.040 inch) between the layers (e.g., the outer gimbal 222 and isothermal dome 120) of the gimbal assembly 104. The outer gimbal 222 and the thermal shells 230 and 232 may be made of magnesium instead of aluminum or beryllium, which is typically used in gimbaled IMUs. In the illustrated example, the second thermal shell 232 includes an optical port 238 similar to the optical port 216 of the isothermal dome 120.

The example outer gimbal 222 includes first and second apertures 239 and 241. The apertures 239 and 241 have a diameter larger than a width of the ring-shaped outer gimbal 222 and, thus, each of the thermal shells 230 and 232 includes curved indents (such as an indent 243) to accommodate for the apertures 239 and 241 in the outer gimbal 222. The first aperture 239 of the outer gimbal 222 includes a middle gimbal motor 240 to control a middle gimbal 242 based on feedback from one or more accelerometers and gyroscopes. The second aperture 241 of the outer gimbal 222 includes a middle gimbal synchro 244 to provide a signal representative of an incremental, angular movement or position of the middle gimbal 242 relative to a zero point. In some examples, slip rings, such as slip ring 246, are disposed within apertures of the middle gimbal motor 242 and/or the middle gimbal synchro 244 to facilitate rotation of the middle gimbal 242 with electrical connection(s). The example middle gimbal motor 240 and middle gimbal synchro 244 may include low friction bearings to facilitate rotation.

The middle gimbal 242 is disposed within the outer gimbal 222 and coupled to the outer gimbal 222 via the middle gimbal motor 240, the middle gimbal synchro 244, and the slip rings 246. In the illustrated example, a slip ring 246 is shown in connection with the middle gimbal synchro 244 and another such slip ring may be disposed in the middle gimbal motor 242. The middle gimbal 242 is substantially ring-shaped and two thermal shells 248 and 250 are coupled to respective opposing sides of the middle gimbal 242 using fasteners disposed through holes 252 passing through the thermal shells 248 and 250. In some examples, the thermal shells 248 and 250 include counter bores 254 in which weights may be disposed. Weights may be added to the counter bores 254 to balance the isothermal shells 248 and/or 250. The middle gimbal 242 and the thermal shells 248 and 250 are machined as an assembly to achieve tight tolerances to provide the substantially small gaps (e.g., 0.020-0.040 inch) between the layers (e.g., the middle gimbal 242 and the outer gimbal 222) of the gimbal assembly 104. The middle gimbal 242 and the thermal shells 248 and 250 may also be made of magnesium.

The example middle gimbal 242 includes first and second opposing apertures 255 and 257. Each of the apertures 255 and 257 has a diameter greater than a width of the ring-shaped middle gimbal 242 and, thus, each of the thermal shells 248 and 250 includes curved indents, such as indent 251, to accommodate the apertures 255, 257 in the middle gimbal 242. The first aperture 255 of the middle gimbal 242 includes an inner gimbal motor 256 to control the stable member 218 (e.g., an inner gimbal) based on feedback from one or more accelerometers and gyroscopes. The second aperture 257 of the middle gimbal 242 includes an inner gimbal synchro 258 to provide a signal representative of an incremental, angular movement or position of the stable member 218 relative to a zero point. In some examples, slip rings, such as slip ring 260, are disposed within apertures of the inner gimbal motor 256 and/or the inner gimbal synchro 258 to facilitate rotation of the stable member 218 with electrical connection(s). The example inner gimbal motor 256 and middle gimbal synchro 258 may include low friction bearings to facilitate rotation.

The stable member 218 is disposed within the middle gimbal 242 and coupled to the middle gimbal 242 via the inner gimbal motor 256, the inner gimbal synchro 258 and the slip rings 260. The stable member 218 includes one or more covers 262 to cover components of the IMU (e.g., electrical components, instruments, etc.). The covers 262 may be bolted onto the stable member 218 using holes disposed in the covers 262. The covers 262 are also shaped to maintain the overall spherical shape of the stable member 218 to maintain the gap between the stable member 218 and the middle gimbal 242 and thermal shells 248 and 250 substantially small (e.g., 0.020-0.040 inch). The stable member 218 may be machined as an assembly to achieve tight tolerances to maintain the substantially small, uniform gap. For example, the stable member 218 may be machined from a block of aluminum.

The example stable member 218 includes a velocity subsystem (VSS) 264 (e.g., an electronics assembly) that digitizes accelerometer instrument signals and may perform some or all data compensation algorithms. A rate subsystem (RSS) 266 is disposed in the stable member 218 opposite the VSS 264. The RSS 266 is an electronics assembly that digitizes gyroscope instrument signals and may perform some or all data compensation algorithms. One or more rings or shims 268 may be disposed adjacent each of the VSS 264 and the RSS 266 to separate the electronics assemblies from the other components and/or instruments (e.g., accelerometers, gyroscopes, etc.) disposed within the stable member 218.

In some examples, one or more of the rings 268 includes a heater or heating element 269 operative to maintain a constant temperature of the VSS 264 or RSS 266. For example, the heater 269 may be operative when the VSS 264 or RSS 266 is not outputting a threshold amount of heat to account for a lower heat output from the VSS 264 or RSS 266 to the instruments within the stable member 218. Maintaining a constant temperature output of the VSS 264 and RSS 266 cavities of the stable member 218 and, more generally, the gimbal assembly 104 facilitates the temperature control of the gimbal assembly 104. For example, the heat output by an electronics assembly (e.g., the VSS 264 or the RSS 266) can vary based on the current use of the electronics assembly (e.g., an electronics assembly not being used outputs less heat than an electronics assembly that is in use). The variation in the heat output by an electronics assembly can be difficult to predict and, thus, the temperature of the fluid in the cooling tubes 124 may not adequately account for the fluctuations in temperature from the VSS 264 and RSS 266 electronics assemblies because the temperature of the electronics assemblies may change more quickly than the temperature of the cooling fluid. Changing the temperature of a cooling fluid takes more time than turning on or off a heating element (e.g., a heater 269 disposed in the rings 268) disposed adjacent the electronics assemblies.

Due to the proximity of the electronics assemblies 264 and 266 to the instruments (e.g., the instruments used for navigation that must be kept at a constant temperature), a drop in temperature due to fluctuations in the heat output by the electronics assemblies could significantly affect the accuracy of the temperature-dependent instruments. The accuracy of these instruments is especially important because the IMU is an autonomous IMU not assisted by external instruments, such as a stellar star sensor, and continuous flight updates are not provided to an operator. The accuracy of the navigation of the vehicle in which the IMU is mounted may be critical (e.g., in the case where the vehicle is a missile) and may depend on maintaining the instruments at a stable temperature. To facilitate the operation of the heaters 269 in the rings 268, one or more sensors may be included within the VSS 264, the RSS 266, and/or the cavities in which the electronics assemblies are disposed.

An instrument cover (e.g., a plate) 270 is also disposed between each of the VSS 264 and the RSS 266 and the instruments within the stable member 218. The instrument cover 270 is operative to protect the instruments (e.g., the gyroscopes and accelerometers) from damage and may also provide an additional heat barrier between the electronics assemblies and the instruments.

Figure 3:
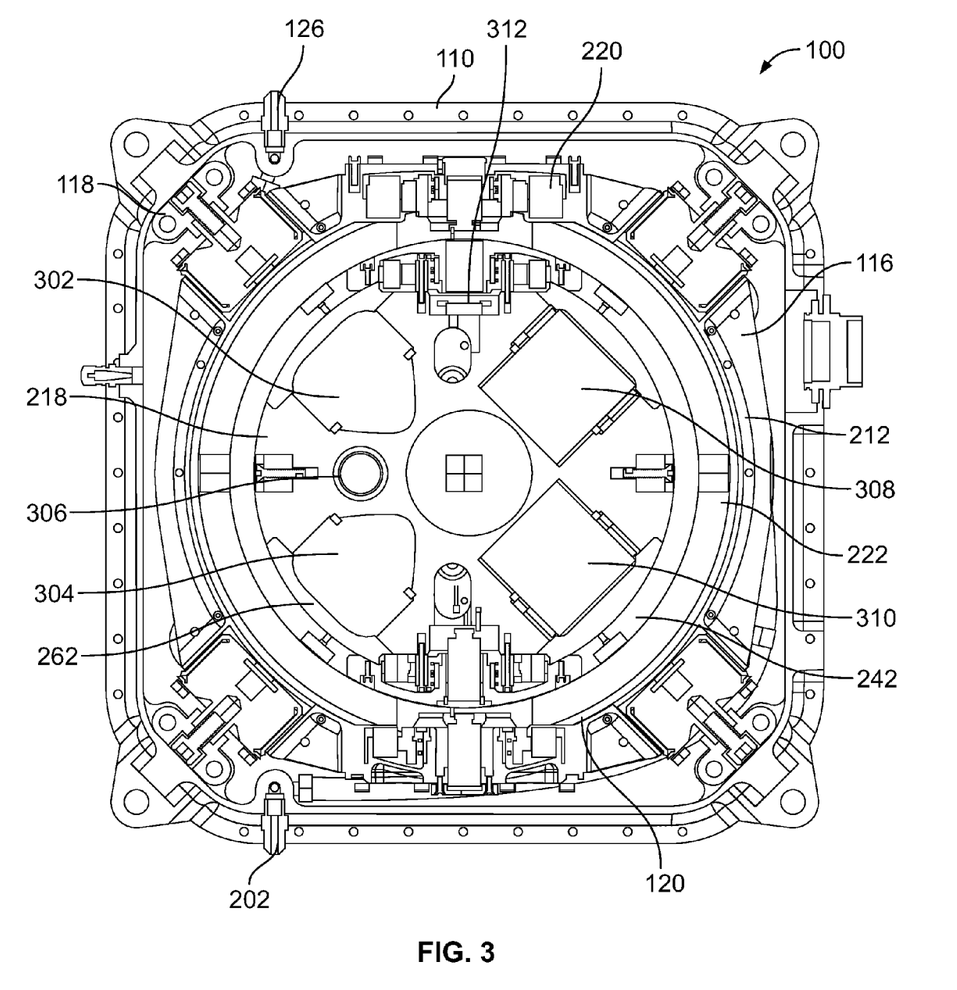
FIG. 3 is a cross-sectional view of the example apparatus of FIG. 1.

FIG. 3 is a cross-sectional view of the example apparatus 100 of FIG. 1. As shown in FIG. 3, the stable member 218 includes instruments (e.g., gyroscopes, accelerometers) disposed within the stable member 218. In the illustrated example, three gyroscopes are visible. The gyroscopes may include an x-direction gyroscope 302, a y-direction gyroscope 304, and a z-direction gyroscope 306. Additionally, the illustrated example apparatus includes an x-direction accelerometer 308, a y-direction accelerometer 310, and a z-direction accelerometer, two of which are visible in the illustrated cross-section of FIG. 3. The illustrated cross-section depicts an orthogonal (e.g., 90 degree) configuration of the accelerometers and the gyroscopes. Alternatively, the accelerometers and/or the gyroscopes may be configured differently. For example, an alternate configuration may use two gyroscopes for flight information and one gyrocompass for location information. In some applications, level detectors may be used to measure a local level of the apparatus.

The illustrated example apparatus also includes a mirror 312. The mirror 312 is operative to allow the operator to determine the position of the stable member 218 within the gimbal assembly 104. In some examples, the mirror 312 is only used during testing and/or calibration. Thus, the apparatus 100 may not include a mirror 312. The mirror 312 is visible via the one or more optical ports 216 and 238 to enable alignment and/or calibration of the example apparatus 100 and/or gimbal assembly 104.

Figure 4:
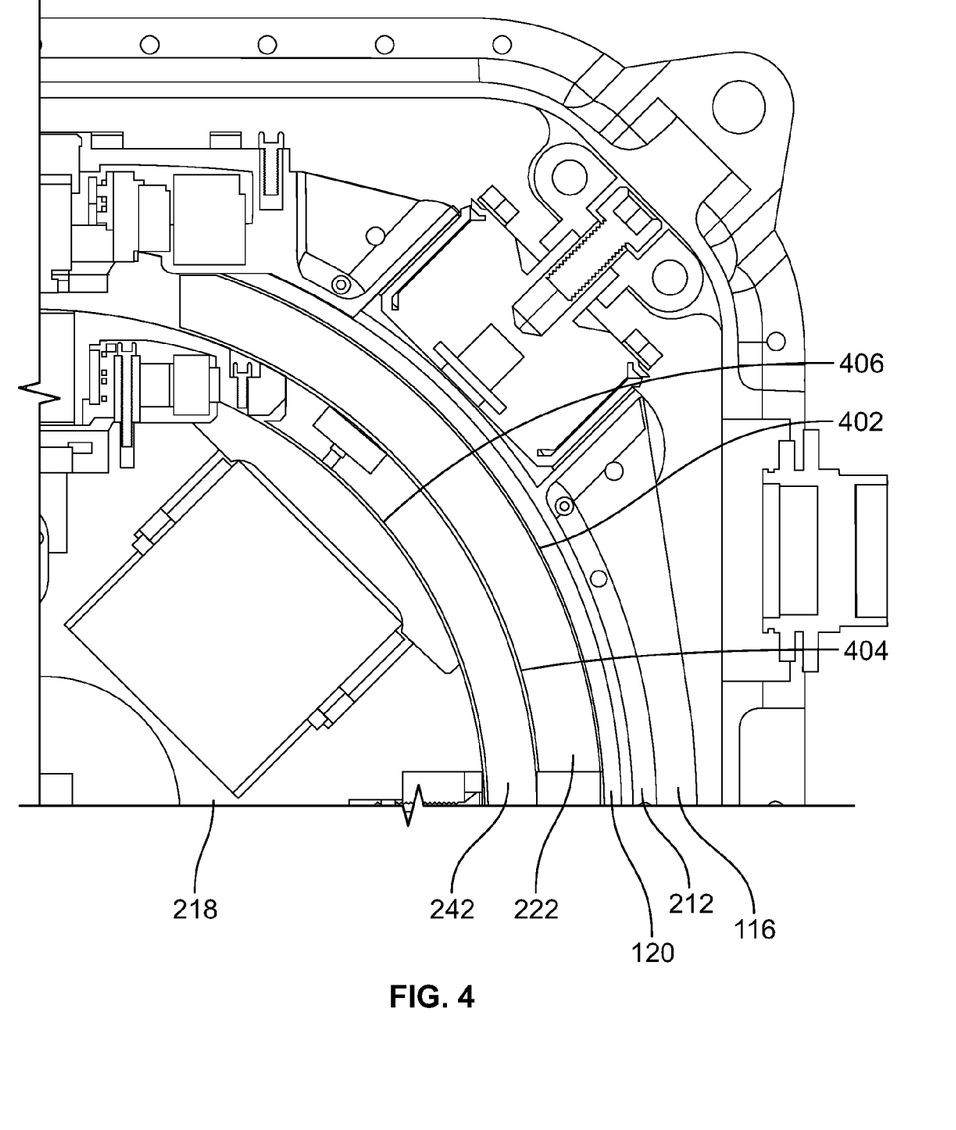
FIG. 4 is a partial cross-sectional view of the example apparatus of FIG. 1.

FIG. 4 is a partial cross-sectional view of the example apparatus of FIG. 1. The partial cross-section depicts the inter-gimbal gaps that are included in the gimbal assembly 104 to enable heat transfer via conduction. The inter-gimbal gaps include an outer gimbal gap 402, which is between the isothermal shell 120 and the outer gimbal 222 and/or the thermal shells 230, 232 coupled to the outer gimbal 222. A middle gimbal gap 404 is between the outer gimbal 222 and/or the thermal shells 230, 232 coupled to the outer gimbal 222 and the middle gimbal 242 and/or the thermal shells 248, 250 coupled to the middle gimbal 242. A stable member gap 406 is between the middle gimbal 242 and/or the thermal shells 248, 250 coupled to the middle gimbal 242 and the stable member 218. The example gaps 402, 404, and 406 have a width of 0.020 inch to 0.040 inch. Alternatively, the gaps may have a different width. The gaps 402, 404, and 406 are sized such that heat transfer due to convention is reduced (e.g., minimized, substantially reduced). Thus, heat transfer via conduction is facilitated by the substantially narrow gaps 402, 404, and 406.

The gaps 402, 404, and 406 may have a nominal width of 0.030 inch. The example gaps 402, 404, and 406 are substantially uniform to enable accurate modeling of the heat transfer via conduction to maintain a temperature of the components within the stable member 218. As used herein, a substantially uniform gap does not deviate from the nominal width of 0.030 inch more than a designated tolerance (e.g., 0.004 inch or 15%), which may be selected such that an actual heat transferred through the gap(s) does not differ from the modeled heat transfer an amount that prevents the temperature of the components from being properly maintained. Any variation in the width of the gaps may be due to machining tolerances associated with the gimbal components.

The gaps 402, 404, and 406 may be filled by a gas composition or combination including nitrogen, helium, and/or neon gas. The combination is selected such that the gas promotes heat transfer via conduction but also remains stable (e.g., non-volatile). The position of each of the components (e.g., gimbals, thermal shells, etc.) is maintained to move no more than 5 thousandths (0.005) of an inch from the initial position of the component.

FIG. 5 is a block diagram of an example inertial measurement unit 500. The example IMU 500 includes gyroscopes for each axis (e.g., the x-direction gyroscope 302, the y-direction gyroscope 304, and the z-direction gyroscope 306). The gyroscopes 302, 304, and 306 are operative to provide rotation information to the RSS electronics assembly 266 related to each axis. The RSS electronics assembly 266 processes the rotation information and provides feedback to the synchros (e.g., electrical resolvers) 224, 244, and 258 and/or motors 220, 240, and 256 so that the synchros 224, 244, and 258 and/or motors 220, 240, and 256 can adjust the position gimbals 218, 222, and 242 in the gimbal assembly 104.

The example IMU 500 also includes accelerometers for each axis (e.g., the x-direction accelerometer 308, the y-direction accelerometer 310, and a z-direction accelerometer 502). The accelerometers 308, 310, and 502 are operative to provide rotation information to the VSS electronics assembly 264 related to each axis. In some examples, the VSS electronics assembly 264 processes the rotation information and provides feedback to the synchros (e.g., electrical resolvers) 224, 244, and 258 and/or motors 220, 240, and 256 so that the synchros 224, 244, and 258 and/or motors 220, 240, and 256 can adjust the position gimbals 218, 222, and 242 in the gimbal assembly 104.

One or more multilayer thermal control elements 504 may be included in the example IMU 500. The multilayer thermal control elements 504 may be operative to perform active heat control for instruments as well as the stable member 218. For example, the heaters 269 in the rings 268 within the stable member 218 may be controlled by and/or operatively coupled to the example multilayer thermal control elements 504. In some examples, the chiller system may receive feedback from the multilayer thermal control elements 504 to control the temperature of the fluid flowing through the cooling tubes 124. The mechanical design of the example apparatus 100 also allows for passive heat control using liquid and gas conduction (e.g., via the cooling tubes 124 and/or the gas composition in the gaps (e.g., the gaps 402, 404, and 406 of FIG. 4).

The example data packaging and communications system 506 may receive inputs from each of the RSS electronics assembly 266, the VSS electronics assembly 264, and the multilayer thermal control elements 504. The data packaging and communications system 506 communicates data between the RSS electronics assembly 266, the VSS electronics assembly 264, and/or the multilayer thermal control elements 504. In some examples, the data packaging and communications system 506 performs control algorithms to control when the heaters 269 turn on and off and the temperature to which the heaters 269 may be set. The data packaging and communications system 506 also packages and communicates data with the gimbaled system (e.g., the motors, the synchros) and/or to a navigation system of the vehicle via the input/output for power and signals 508.

From the foregoing, it will be appreciated that the above disclosed apparatus and articles of manufacture are operative to maintain a substantially constant temperature of a gimbal assembly and an automatic IMU using conduction cooling.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:
1. An apparatus comprising:
an inertial measurement unit;
a gimbal assembly in which the inertial measurement unit is disposed, the gimbal assembly having gaps between each gimbal of the gimbal assembly, the gaps sized to reduce convective heat transfer and facilitate conductive heat transfer between each gimbal, the gaps including a gas to conduct heat from the gimbal assembly; and
an isothermal dome at least partially surrounding the gimbal assembly, the isothermal dome having a cooling tube disposed on an external surface of the isothermal dome to transfer heat from the gimbal assembly via conduction.

2. The apparatus of claim 1, wherein the gimbal assembly includes an outer gimbal, a middle gimbal, and stable member, each of the gimbals having a respective thermal shell to conduct heat to the isothermal dome.

3. The apparatus of claim 1, wherein the isothermal dome is to be cooled by a fluid flowing through the cooling tube, the fluid having a controlled temperature to maintain a substantially constant temperature of the inertial measurement unit.

4. The apparatus of claim 1, wherein the inertial measurement unit includes an electronics assembly, gyroscopes, and accelerometers, wherein the electronics assembly is positioned within a cavity adjacent to the gyroscopes and accelerometers and separated from the gyroscopes and accelerometers by a plate.

5. The apparatus of claim 4, further including heaters disposed within the cavity, the heaters operative when an amount of heat output by the electronics assembly is below a threshold, the heaters to maintain a substantially constant temperature of the gimbal assembly.

6. The apparatus of claim 1, wherein the gas includes nitrogen, helium, or neon gas.

7. The apparatus of claim 1, further including a hermetic enclosure surrounding the isothermal dome.

8. The apparatus of claim 7, wherein the gimbal assembly is mounted to the hermetic enclosure using isolators disposed between the hermetic enclosure and the gimbal assembly, the isolators to reduce an interference to the inertial measurement unit from motion.

9. An apparatus comprising:
a stable member of a gimbal assembly, the stable member including an electronics assembly disposed within a cavity of the stable member;
an inertial measurement unit of a navigation system including a gyroscope and an accelerometer, the gyroscope and accelerometer disposed within the stable member;
one or more gimbals operatively coupled to the stable member, each of the one or more gimbals including a thermal shell attached to a central portion of the gimbal to facilitate conductive heat transfer;
gaps between each gimbal sized to reduce convective heat transfer and facilitate conductive heat transfer between each gimbal; and
an isothermal dome at least partially surrounding the one or more gimbals, the isothermal dome including a cooling tube to enable cooling of the inertial measurement unit via conductive heat transfer.

10. The apparatus of claim 9, wherein the thermal shell includes two portions, the portions coupled to opposite sides of the central portion of each gimbal.

11. The apparatus of claim 9, wherein the gaps are filled with a thermally conductive gas.

12. The apparatus of claim 9, wherein the inertial measurement unit is maintained at a substantially constant temperature via the conductive heat transfer.

13. The apparatus of claim 12, further including heaters disposed within the stable member to maintain the stable member at a substantially constant temperature.

14. The apparatus of claim 9, further including a hermetic enclosure surrounding the isothermal dome.

15. The apparatus of claim 9, wherein the cooling tubes are to convey a controlled temperature fluid to maintain a substantially constant temperature of the inertial measurement unit.

16. An apparatus comprising:
   means for enclosing a gimbal assembly;
   means for facilitating conductive heat transfer between gimbals of the gimbal assembly; and
   means for providing a cooling fluid operatively coupled to the means for enclosing, the cooling fluid to control a temperature of the gimbal assembly using conduction.

17. The apparatus of claim 16, wherein the means for providing a cooling fluid is disposed on an external surface of the means for enclosing.

18. The apparatus of claim 16, further comprising means for conduction disposed within the gimbal assembly, the means for conduction to transfer heat from the gimbal assembly to the means for providing the cooling fluid.

19. The apparatus of claim 1, wherein the gaps have a width between 0.020 inch and 0.040 inch.

20. The apparatus of claim 1, wherein the gaps have a nominal width of 0.030 inch.

* * * * *